(12) United States Patent
Suzuki et al.

(10) Patent No.: US 6,518,514 B2
(45) Date of Patent: Feb. 11, 2003

(54) CIRCUIT BOARD AND PRODUCTION OF THE SAME

(75) Inventors: Takeshi Suzuki, Osaka (JP); Tatsuo Ogawa, Atlanta, GA (US); Yoshihiro Bessho, Osaka (JP); Satoru Tomekawa, Osaka (JP); Yasuhiro Nakatani, Osaka (JP); Yoji Ueda, Osaka (JP); Susumu Matsuoka, Osaka (JP); Daizo Andoh, Osaka (JP); Fumio Echigo, Osaka (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 0 days.

(21) Appl. No.: 09/928,869

(22) Filed: Aug. 13, 2001

(65) Prior Publication Data

US 2002/0038725 A1 Apr. 4, 2002

(30) Foreign Application Priority Data

Aug. 21, 2000 (JP) .......................................... 2000-250065
Oct. 6, 2000 (JP) .......................................... 2000-307310

(51) Int. Cl.[7] ............................ H01R 12/04; H05K 1/11
(52) U.S. Cl. .................. 174/262; 174/255; 174/256; 174/258; 174/264; 362/792; 362/795
(58) Field of Search ................................. 174/262, 264, 174/258, 256, 259, 261, 255; 361/792, 795

(56) References Cited

U.S. PATENT DOCUMENTS

| | | | |
|---|---|---|---|
| 3,264,402 A | | 8/1966 | Shaheen et al. |
| 4,372,804 A | | 2/1983 | Hanabusa et al. |
| 4,383,363 A | | 5/1983 | Hayakawa et al. |
| 4,648,179 A | * | 3/1987 | Bhattacharyya et al. .... 174/258 |

(List continued on next page.)

FOREIGN PATENT DOCUMENTS

| EP | 0 568 930 | 11/1993 |
|---|---|---|
| JP | 2-283094 | 11/1990 |

(List continued on next page.)

OTHER PUBLICATIONS

N. Fukutomi et al. "Development of Fine Line Printed Wiring Technology by Plated Wiring Pattern Transfer Method" *The Institute of Electronics, Information and Communication Engineers*, C–II, vol. J72–C–II, No. 4, pp. 243–253 (with English abstract).
EPO Search Report

*Primary Examiner*—Kamand Cuneo
*Assistant Examiner*—I B Patel
(74) *Attorney, Agent, or Firm*—Merchant & Gould P.C.

(57) ABSTRACT

A circuit board is configured so as to include not less than two wiring layers, an insulator layer for electric insulation between the wiring layers, and an inner-via-hole conductive member provided in the insulator layer in a thickness direction of the insulator layer, for electric connection between the wiring layers. The insulator layer is made of a composite material containing an organic resin and a material having a smaller thermal expansion coefficient than that of the organic resin, and includes a surface part, a core part, and a surface part laminated in the stated order, the surface part having a high content of the organic resin, the core part having a low content of the organic resin. The wiring layers have a land portion that is connected with the inner-via-hole conductive member, the land portion being embedded so as to be substantially in contact with the core part, and the inner-via-hole conductive member has a thickness substantially equal to a thickness of the core part. According to this configuration, a part of the metal foil is embedded in the insulator layer so as to be in contact with the core layer. Therefore, this makes it possible to provide a circuit board in which portions of the conductive material can be selectively compressed, and which hence is capable of ensuring stable connection between layers.

17 Claims, 10 Drawing Sheets

U.S. PATENT DOCUMENTS

| | | | |
|---|---|---|---|
| 4,678,963 A | 7/1987 | Fonda | |
| 4,865,888 A | 9/1989 | Akahoshi et al. | |
| 5,046,238 A | 9/1991 | Daigle et al. | |
| 5,326,966 A | 7/1994 | Fukuda et al. | |
| 5,346,750 A | 9/1994 | Hatakeyama et al. | |
| 5,359,259 A | 10/1994 | Reidinger et al. | |
| 5,374,469 A | 12/1994 | Hino et al. | |
| 5,407,511 A | 4/1995 | Nakatani et al. | |
| 5,440,075 A | 8/1995 | Kawakita et al. | |
| 5,478,972 A | 12/1995 | Mizutani et al. | |
| 5,480,503 A | 1/1996 | Casey et al. | |
| 5,481,795 A | 1/1996 | Hatakeyama et al. | |
| 5,484,647 A | 1/1996 | Nakatani et al. | |
| 5,498,467 A | 3/1996 | Meola | |
| 5,576,519 A | 11/1996 | Swamy | |
| 5,595,943 A | 1/1997 | Itabashi et al. | |
| 5,652,042 A | 7/1997 | Kawakita | |
| 5,707,925 A | 1/1998 | Akada et al. | |
| 5,719,354 A | 2/1998 | Jester | |
| 5,744,758 A | 4/1998 | Takenouchi et al. | |
| 5,860,818 A | 1/1999 | Sakaki et al. | |
| 5,914,358 A * | 6/1999 | Kawakita et al. | 252/512 |
| 5,937,725 A | 8/1999 | Kamijo et al. | |
| 5,950,306 A | 9/1999 | Suzuki et al. | |
| 5,956,843 A * | 9/1999 | Mizumoto et al. | 174/257 |
| 6,051,918 A | 4/2000 | Hayashi et al. | |
| 6,137,054 A | 10/2000 | Uezono et al. | |
| 6,143,116 A * | 11/2000 | Hayashi et al. | 156/233 |
| 6,197,407 B1 | 3/2001 | Andou et al. | |
| 6,224,965 B1 | 5/2001 | Haas et al. | |
| 6,242,079 B1 * | 6/2001 | Mikado et al. | 174/250 |
| 6,329,610 B1 * | 12/2001 | Takubo et al. | 174/255 |
| 6,353,189 B1 * | 3/2002 | Shimada et al. | 174/255 |
| 6,365,843 B1 * | 4/2002 | Shirai et al. | 174/255 |

FOREIGN PATENT DOCUMENTS

| | | |
|---|---|---|
| JP | 6-21619 | 1/1994 |
| JP | 6-268345 | 9/1994 |
| JP | 6-318783 | 11/1994 |
| JP | 7-147464 | 6/1995 |
| JP | 7-263828 | 10/1995 |
| JP | 8-213757 | 8/1996 |
| JP | 8-255982 | 10/1996 |
| JP | 8 287840 | 11/1996 |
| JP | 8 298078 | 11/1996 |
| JP | 2 601128 | 1/1997 |
| JP | 2 134436 | 12/1997 |
| JP | 10-13028 | 1/1998 |
| JP | 10-84186 | 3/1998 |
| JP | 6-356991 | 3/1998 |
| JP | 2000-77800 | 3/2000 |

* cited by examiner

CIRCUIT BOARD AND PRODUCTION OF THE SAME

FIELD OF THE INVENTION

The present invention relates to a circuit board excelling in connection reliability and wiring-pattern adhesive strength, and to a method for producing the same.

BACKGROUND OF THE INVENTION

Recently, following the tendency of electronic devices toward compact size, less weight, improved function, and improved performance, it is increasingly demanded, not only in industrial equipment fields but also widely in consumer equipment fields, to supply inexpensive multi-layer circuit boards on which semiconductor chips such as LSIs can be mounted at a high density.

In response to the demand of the market, a technology has been developed whereby, in place of a conventional ceramic multi-layer board, a resin multi-layer circuit board available at a lower price is rendered suitable for high-density mounting.

A circuit board of "ALIVH" (a trademark of Mastushita Electric Industrial Co., Ltd.) structure, that is, a circuit board having an inner via hole structure for all layers, for instance, has been proposed as the above circuit board (JP6(1994)-268345A). This circuit board can be supplied at a relatively low price since it is a resin multi-layer board in which insulator layers are made of a composite material of a non-woven aramid fabric reinforcer and an epoxy resin. It is also suitable for high-density mounting since the inner-via-hole connection technique permits arbitrary portions of wiring layers to be connected via a conductive paste, that is, the "ALIVH" structure is applied.

In such a circuit board, it is important to secure the reliability of the inner-via-hole connection, but the reliability of inner-via-hole connection has had problems as described below.

Specifically, inner-via-hole connectors are made of a different component material from that of an insulator layer, thereby having different physical properties (thermal expansion coefficient, humidity expansion coefficient, etc.) from those of the insulator layer. Therefore, because of the mismatch between an organic resin material for the insulator layer that has a relatively great thermal expansion coefficient and an inner-via-hole connector material containing a metal with a relatively small thermal expansion coefficient as a main component, there particularly has been a drawback in that stress in a thickness direction occurs inside the inner-via-hole connector material due to a heat cycle. When an excessive stress is applied, IHV connectors are damaged, thereby causing the connection reliability to deteriorate.

A technique that seems to be applicable for solving this problem is a technique of decreasing the difference between the physical properties of materials forming the insulator layer and the inner-via-hole connectors so as to prevent the damage to the IHV connectors. To be more specific, by adding an inorganic filler such as silica to a resin of the insulator layer so as to decrease the content of the resin in the insulator layer, the thermal expansion coefficient of the insulator layer is decreased.

The resin of the insulator layer, however, functions for firmly bonding the wiring layer to the insulator layer. In the case where the insulator layer includes a decreased content of the resin in surface part, it loses its adhesive strength, and problems arise such as exfoliation of the wiring layer, exfoliation of components mounted on a component-mount surface together with pads, etc. Thus, the aforementioned technique does not suffice.

SUMMARY OF THE INVENTION

The present invention has been made to solve the aforementioned problems in the prior art, and it is an object of the present invention to provide a circuit board that exhibits sufficient bond strength between the wiring layer and the insulator layer and that provides excellent inner-via-hole connection reliability, as well as to provide a method for producing the circuit board.

To achieve the above object, a circuit board of the present invention includes:

not less than two wiring layers, an insulator layer for electric insulation between the wiring layers; and an inner-via-hole conductive member provided in the insulator layer in a thickness direction of the insulator layer for electric connection between the wiring layers, wherein:

the insulator layer is made of a composite material containing an organic resin and a material having a smaller thermal expansion coefficient than that of the organic resin, and includes a surface part, a core part, and a surface part laminated in the stated order, the surface part having a relatively high content of the organic resin, the core part having a relatively low content of the organic resin;

the wiring layers have a land portion that is connected with the inner-via-hole conductive member, the land portion being embedded so as to be substantially in contact with the core part; and the inner-via-hole conductive member has a thickness substantially equal to a thickness of the core part.

A first circuit board production method of the present invention is a method for producing a circuit board that includes not less than two wiring layers, an insulator layer for electric insulation between the wiring layers, and an inner-via-hole conductive member provided in the insulator layer in a thickness direction of the insulator layer for electric connection between the wiring layers, and the circuit board producing method comprises the steps of:

making an insulator layer of a composite material containing an organic resin and a material having a smaller thermal expansion coefficient than that of the organic resin so that the insulator layer includes a surface part, a core part, and a surface part laminated in the stated order, the surface part having a relatively high content of the organic resin, the core part having a relatively low content of the organic resin;

opening an inner via hole in the insulator layer in a thickness direction of the insulator layer, and filling the inner via hole with a conductive material;

providing metal foils on both sides of the insulator layer, each metal foil having a protruded portion at a predetermined position so that the position coincides with a position of the inner via hole filled with the conductive material;

applying heat and pressure to external sides of the metal foils by hot pressing so that the protruded portions of the metal foils come substantially in contact with the core part of the insulator layer, to cause the inner via hole filled with the conductive material to form an inner-via-hole conductive member with a thickness substantially equal to a thickness of the core part; and etching the metal foils so as to leave the protruded portion as the land portion.

A second circuit board producing method of the present invention is a method for producing a circuit board including not less than two wiring layers, an insulator layer for electric insulation between the wiring layers, and an inner-via-hole conductive member provided in the insulator layer in a thickness direction of the insulator layer, for electric connection between the wiring layers, and the circuit board producing method comprises the steps of:

making an insulator layer of a composite material containing an organic resin and a material having a smaller thermal expansion coefficient than that of the organic resin so that the insulator layer includes a surface part, a core part, and a surface part laminated in the stated order, the surface part having a relatively high content of the organic resin, the core part having a relatively low content of the organic resin;

opening an inner via hole in the insulator layer in a thickness direction of the insulator layer, and filling the inner via hole with a conductive material;

providing transfer bases on both sides of the insulator layer, each of the transfer bases having a metal foil patterned in a predetermined pattern so as to coincide with a position of the inner via hole filled with the conductive material; and applying heat and pressure to external sides of the transfer bases by hot pressing so that the metal foils come substantially in contact with the core part of the insulator layer, to cause the inner via hole filled with the conductive material to form an inner-via-hole conductive member with a thickness substantially equal to a thickness of the core part.

In the above, "the inner-via-hole conductive member has a thickness substantially equal to a thickness of the core part" means that the thickness of the inner-via-hole conductive member is equal to the thickness of the core part, or not-more-than-10% greater than the thickness of the core part, or not-more-than-5-$\mu$m greater than the thickness of the core part.

According to the present invention, the wiring layers are held by an organic resin excelling in adhesiveness, while mismatch hardly occurs between the thermal expansion coefficients. Therefore, it is possible to provide a circuit board that exhibits sufficient bond strength between the wiring layer and the insulator layer, and that provides excellent inner-via-hole connection reliability, as well as to provide a method for producing the circuit board. Furthermore, since a part of the metal foil is embedded in the insulator layer so as to be in contact with the core layer thereof, portions of the conductive material can be selectively compressed, and hence this makes it possible to provide a circuit board capable of ensuring stable connection between layers.

DETAILED DESCRIPTION OF THE INVENTION

Figure 1:
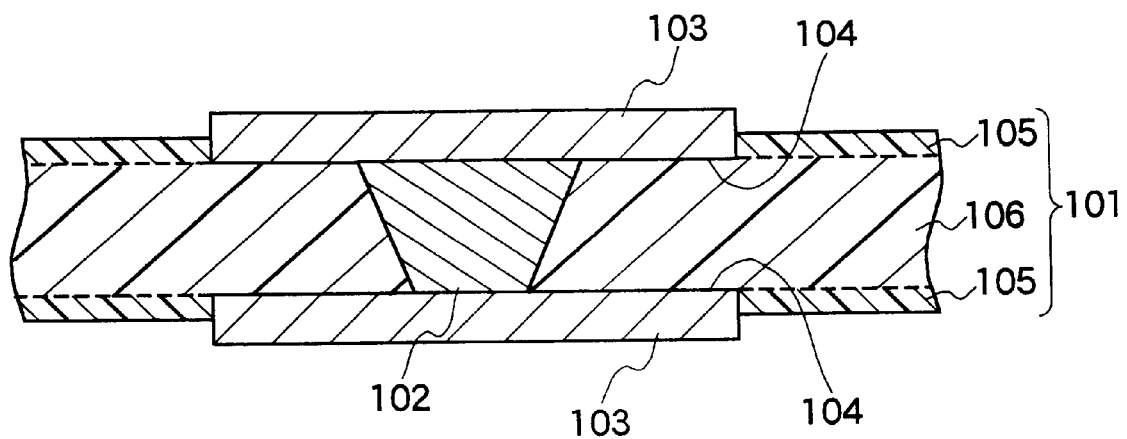
FIG. 1 is a cross-sectional view schematically illustrating a circuit board according to an embodiment of the present invention.

In the configuration of the circuit board of the present invention, the material having a thermal expansion coefficient smaller than that of the organic resin preferably is a fabric of an inorganic fiber. According to this preferable example, it is possible to provide a circuit board that not only has the sufficient bond strength and the excellent inner-via-hole connection reliability, but also excels in rigidity and mechanical strength of the whole circuit board at a lower cost. Further, in this case, the foregoing nonwoven fabric preferably is a glass nonwoven fabric.

Furthermore, in the configuration of the circuit board of the present invention, the material having a thermal expansion coefficient smaller than that of the organic resin preferably is a nonwoven fabric of an inorganic fiber. According to this preferable example, it is possible to provide a circuit board that not only has the sufficient bond strength and the excellent inner-via-hole connection reliability, but also excels in mechanical strength at a lower cost. Further, in this case, the foregoing nonwoven fabric preferably is a glass nonwoven fabric.

Furthermore, in the configuration of the circuit board of the present invention, the material having a thermal expansion coefficient smaller than that of the organic resin preferably is an organic film. According to this preferable example, it is possible readily to obtain an insulator layer with a uniform thickness, in addition to the sufficient bond strength and the excellent inner-via-hole connection reliability, and it is possible to provide a circuit board whose impedance is controlled readily. In this case, the organic film preferably is an organic film made of at least one selected from the group consisting of polyimide, benzocyclobutene (BCB), polytetrafluoroethylene (PTFE), aramid, polyparaphenylene benzobisoxazole (PBO), and all aromatic polyesters.

In the configuration of the circuit board of the present invention, the material having a thermal expansion coefficient smaller than that of the organic resin preferably is an inorganic filler. According to this preferable example, it is possible readily to provide a circuit board to which, in addition to the sufficient bond strength and the excellent inner-via-hole connection reliability, properties such as heat conductivity are given by selecting the type of the inorganic filler and the composition ratio. Furthermore, in this case, the inorganic filler preferably is at least one inorganic filler selected from the group consisting of aluminum hydroxide, aluminum oxide (alumina), silicon dioxide (silica), and silicon nitride.

Furthermore, in the configuration of the circuit board of the present invention, the material having a thermal expansion coefficient smaller than that of the organic resin preferably is made of a porous material. According to this preferable example, it is possible to provide a circuit board that has improved rigidity and increased mechanical strength as to the whole circuit board, in addition to the sufficient bond strength and the excellent inner-via-hole connection reliability. Furthermore, in this case, the porous material made of the organic resin preferably is impregnated with a composition of an inorganic filler and an organic resin, so as to form the core part. In this case, furthermore, the porous material preferably is made of a fluororesin, and the inorganic filler preferably is at least one inorganic filler selected from the group consisting of aluminum hydroxide, aluminum oxide (alumina), silicon dioxide (silica), and silicon nitride. The fluororesins are suitable for high-frequency circuits since they have a low dielectric constant.

Furthermore, in the configuration of the circuit board of the present invention, the foregoing organic resin preferably is at least one organic resin selected from the group consisting of epoxy resins, polyimide resins, cyanate ester resins, phenol resol resins, all aromatic polyester resins, polyphenylene ether (PPE) resins, bismaleimide triazine resins, and fluororesins. In this case, the organic resin preferably is impregnated with at least one inorganic filler selected from the group consisting of aluminum hydroxide, aluminum oxide (alumina), silicon dioxide (silica), and silicon nitride.

Furthermore, in the configuration of the circuit board of the present invention, the inner-via-hole conductive material preferably is made of a composite material of a conductive filler and an organic resin. In this case, the conductive filler preferably is made of at least one selected from the group consisting of gold, silver, copper, nickel, palladium, lead, tin, indium, and bismuth, alloys of these, and mixtures of these.

The following description will explain the present invention in more detail referring to the following embodiment.

FIG. 1 is a cross-sectional view schematically illustrating a circuit board (double-sided circuit board) of the present invention. As shown in FIG. 1, a circuit board of the present invention includes an insulator layer 101, inner-via-hole connectors 102 formed in the insulator layer 101 and made mainly of a metal, and lands 103 embedded in the insulator layer 101. Here, the insulator layer 101 is composed of surface parts 105 made of an organic resin and a core part 106, and surfaces 104 of the lands 103 in contact with the inner-via-hole connectors 102 are substantially in the same plane that includes interfaces between the surface parts 105 and the core part 106. Further, each inner-via-hole connector 102 has substantially the same thickness of the core part 106. The core part 106 preferably has a thickness in a range of 5 $\mu$m to 200 $\mu$m. Furthermore, a resin content in the foregoing core part preferably is in a range of 0 percent by weight (wt %) to 50 wt %.

The surface parts 105 of the insulator layer 101 are made of an organic resin layer, and serve to retain and fix the lands 103. The organic resin layer has a thickness in a range of 2 $\mu$m to 50 $\mu$m. It should be noted that the organic resin may be used for forming the surface parts of the circuit board of the present invention as long as it exhibits a sufficient adhesive strength, even in the case where an inorganic filler is dispersed therein or a material of the core part 106 with a small thermal expansion coefficient is mixed therein.

In FIG. 1, a through hole filled with the inner-via-hole connector material (conductive member) 102 is in a tapered shape, having a wider upper part as viewed in the cross-sectional view, and a conductive paste is put therein from the upper side. It is easier to fill the conductive paste therein from the wide opening on the upper side. In the case where, for instance, the core part 106 is a resin-impregnated glass cloth, the through hole having the wider opening on the upper side as shown in FIG. 1 may be formed by one to three shots of a carbon dioxide gas laser with a wavelength of 9.4 $\mu$m to 10.6 $\mu$m.

The following description will depict organic materials that can be used in the circuit board of the present invention, and materials for the wiring layer and the inner-via-hole connectors.

(a) Organic Resin

Examples adaptable as the organic resin in the present invention include thermoplastic or thermosetting organic resins such as epoxy resins, polyimide resins, cyanate ester resins, phenol resol resins, all aromatic polyester resins, polyphenylene ether (PPE) resins, bismaleimide triazine resins, and fluororesins. Furthermore, any one of the foregoing organic resins further containing inorganic fillers such as aluminum hydroxide, aluminum oxide (alumina), silicon dioxide (silica), and silicon nitride may be used. In the case where a resin composition containing an inorganic filler is used, a content of the inorganic filler preferably is not more than 70 percent by volume (vol %). When the inorganic filler exceeds 70 vol %, a content of the organic resin in the resin composition is insufficient for retaining the wiring layer, and an adhesive strength exerted between the wiring layer and the resin composition decreases greatly.

(b) Composition of Inner-Via-Hole Connector Material

Inner-via-hole connectors of the present invention can be made of a conductive resin composition containing a conductive filler.

The conductive filler may be made of at least one metal selected from gold, silver, copper, nickel, palladium, lead, tin, indium, and bismuth, or an alloy or a mixture of any of these metals. Furthermore, also useful are coated fillers that are composed of balls made of the aforementioned metals, alloys, oxides such as alumina or silica, or organic synthetic resins, and are coated with the aforementioned metals and alloys.

The shape is not limited in particular, and for example, powdery fillers, fiber-form fillers, powdery granulated fillers, spherical-ball-like fillers, and mixtures of any of these can be used.

Examples of the resin used as a binder for the resin composition include fluid epoxy resins, polyimide resins, cyanate ester resins, and phenol resol resins. Examples of the epoxy resins include glycidyl ether epoxy resins such as bisphenol A epoxy resin, bisphenol F epoxy resin, and bisphenol AD epoxy resin, and epoxy resins each having two or more epoxy groups such as alicyclic epoxy resin, glycidyl amine epoxy resin, and glycidyl ester epoxy resin.

The material may contain additives such as solvents or dispersants, for instance, butyl cellosolve, ethyl cellosolve, butyl carbitol, ethyl carbitol, butyl carbitol acetate, ethyl carbitol acetate, α-terpineol, etc., as required.

The material for the inner-via-hole connectors is not limited to a conductive composition. The inner-via-hole connectors of the circuit board of the present invention may be metallic via posts formed by a wet process like plating or a vapor process such as sputtering vapor deposition, or may be formed by filling metallic balls.

(c) Wiring Layers

Metal foils such as copper foils may be used for forming the wiring layers of the circuit board of the present invention. The thickness of the same is not limited as long as the copper foil has a thickness greater than that of the surface part 105 of the insulator layer 101, and hence, those with a thickness of 3 $\mu$m to 35 $\mu$m that are used in ordinary circuit boards are suitable. It should be acknowledged that thicker metal foils than those may be used also. The metal foil preferably is embedded in the electric insulator layer to a depth of 5% to 50% of the thickness of the metal foil.

A metal foil formed on a supporting substrate (carrier), that is, a so-called carrier-borne metal foil, may be used as the above metal foil. A typical carrier-borne metal foil is a copper foil laminated on an aluminum carrier with a parting layer interposed therebetween, which is available commercially. In the case where this is adapted in an embodiment of the present invention, the copper foil is patterned beforehand by etching with, for instance, an aqueous solution of iron chloride or an aqueous solution of ammonium persulfate, and the wiring pattern is laminated and embedded in the insulator layer 101. Thereafter, the aluminum carrier is removed by etching with hydrochloric acid or the like. The use of a carrier-borne metal foil makes it possible to configure the wiring layer so that the land 103 does not protrude from the surface of the insulator layer 101 by selecting the thickness of the metal foil. In other words, by using the metal foil with a thickness substantially equal to that of the resin layer on the surface, the wiring layer can be configured so that the lands do not protrude from the surface of the insulator layer, while by using a thicker metal foil than the resin layer on the surface, the lands are made to protrude.

A method of transferring a wiring pattern formed on a supporting substrate to the insulator base material to form a circuit board, as described above, is referred to as a transferring technique. A carrier on which a wiring pattern is formed is referred to as a transfer formative base. The carrier-borne metal foil used in the transferring technique is not limited to the above-described combination of the aluminum carrier and the metal foil, and for instance, a metal foil may be formed on a resin substrate (carrier). The carrier is removable by sandblast. Alternatively, a carrier-borne metal foil may be formed by causing the carrier and the wiring pattern to temporarily adhere with each other by using an adhesive sheet. For instance, by using "LIBAALFA" (trade name, produced by Nitto Denko Corporation), which is an adhesive sheet that easily loses the adhesive strength due to heat, the carrier is removed readily by applying heat at approximately 150° C. after a circuit board is formed.

Furthermore, as another technique for forming a wiring layer, a technique for forming a wiring pattern by partial etching of a normal metal foil (partial etching technique) is applicable. The following description will depict the same by taking a case where a copper foil is used as the metal foil.

First of all, a wiring pattern is formed by etching the copper foil to approximately a half thickness from one side thereof, with an aqueous solution of iron chloride, an aqueous solution of ammonium persulfate, or the like. Then, after the wiring pattern is laminated and embedded in the insulator layer 101, the remaining copper foil is patterned by etching with an aqueous solution of iron chloride, an aqueous solution of ammonium persulfate, or the like. By using the partial etching technique, the wiring layer is configured so that the lands 103 protrude from the surface of the insulator layer 101. Therefore, the partial etching technique is suitable for forming a multi-layer circuit board.

The wiring layer of the present invention may be formed by a wet process such as plating, or a vacuum process such as sputtering vapor deposition.

First Embodiment

Figure 2:
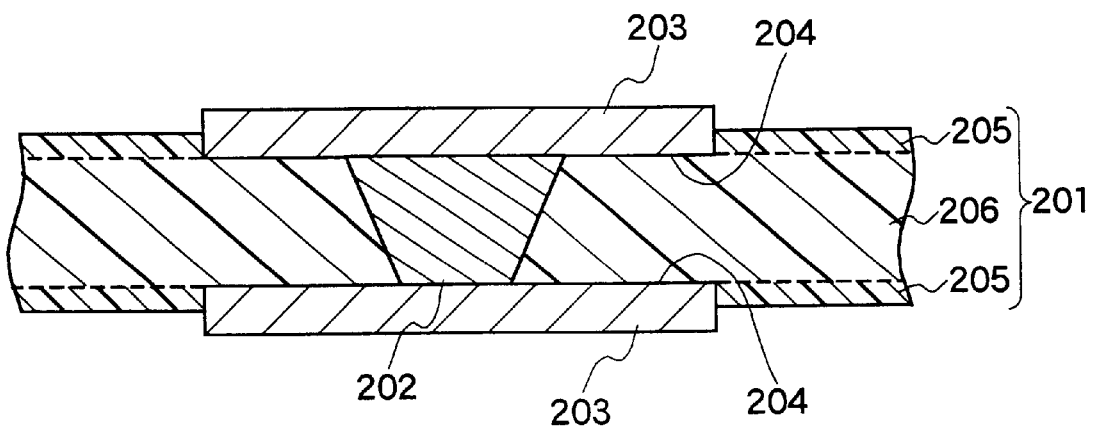
FIG. 2 is a cross-sectional view schematically illustrating a circuit board according to a first embodiment of the present invention.

FIG. 2 is a cross-sectional view schematically illustrating a circuit board (double-sided circuit board) of a first embodiment of the present invention. As shown in FIG. 2, the circuit board of the present embodiment is composed of an insulator layer 201 made of an organic resin and a fabric of an inorganic fiber (a material with a smaller thermal expansion coefficient than that of the organic resin), inner-via-hole connectors 202 formed in the insulator layer 201, and lands 203 embedded in the insulator layer 201. Here, the insulator layer 201 includes surface parts 205 in which the organic resin is a main component (the percentage of the organic resin is high) and a core part 206 in which the inorganic fiber fabric is a main component (the percentage of the organic resin is low), and surfaces 204 of the lands 203 in contact with the inner-via-hole connector 202 substantially are in the plane that includes interfaces between the surface parts 205 and the core part 206. A thickness of the inner-via-hole connector 202 is substantially equal to that of the core part 206.

The following description will depict the circuit substrate according to the present embodiment in more detail, by taking as an example a case where the insulator layer 201 is made of a glass epoxy base material, the inner-via-hole connector 202 is made of a composition of copper and an epoxy resin, and the wiring layer is made of a copper foil.

Figure 3A:
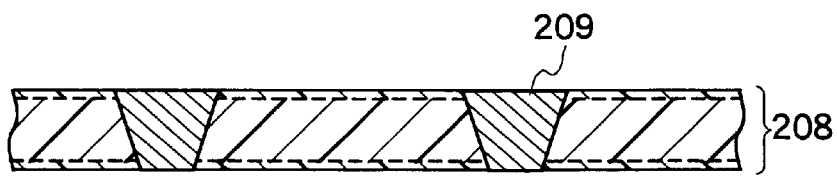
FIGS. 3A to 3E are cross-sectional views illustrating a process of producing the circuit board according to the first embodiment of the present invention.

First of all, as shown in FIG. 3A, a glass epoxy base material 208 in a prepare state (semi-hardened state) (hereinafter referred to as "glass epoxy prepare", having a core layer with a thickness of 100 $\mu$m and resin layers on the surfaces with a thickness of 10 $\mu$m each) is perforated so that through holes are provided at desired positions, and the through holes are filled with a paste-like copper-epoxy resin composition 209 by printing or another technique.

The through holes are formed by a normal circuit board perforating technique. Examples of perforating techniques include mechanical perforating techniques utilizing drills or punchers, and laser perforating techniques using carbon dioxide gas laser, excimer laser, or YAG laser. To open tapered perforations as shown in FIG. 3A, a carbon dioxide gas laser among the above, having a wavelength of 9.4 $\mu$m or 10.6 $\mu$m, is used, and one to three shots of the same are applied.

Figure 3B:
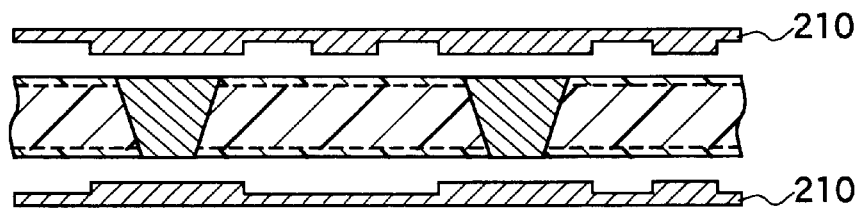

Subsequently, the wiring layer is formed by the foregoing partial etching technique. First of all, wiring patterns are formed on copper foils 210 by etching the same to approximately half of their thickness from one side thereof each, with an aqueous solution of iron chloride, an aqueous solution of ammonium persulfate, or the like (FIG. 3B).

Next, the copper foils 210 are placed on both sides of the glass epoxy prepare 208 filled with the paste-like copper-epoxy resin composition 209 so that wiring-pattern-formed surfaces of the copper foils 201 face the glass epoxy prepare 208, and heat and pressure is applied thereto by hot pressing. The conditions for this process are a heating temperature of 180° C. to 250° C., a pressure of 30 kgf/cm² to 200 kgf/cm², and a heating time of 0.5 hour to 2 hours.

In this process, the epoxy resin as thermosetting resin is hardened, and the glass epoxy prepare 208 and the wiring pattern are bonded with each other. A glass epoxy base material, which is the glass epoxy prepare 208 in a state in which the epoxy resin has been hardened, constitutes an insulator layer. Through this process, the copper foils 210 are embedded in the insulator layer so that wiring-pattern-formed surfaces of the copper foils 210 substantially are in the planes that include the interfaces between the surface parts having a high content of the epoxy resin and the core part (having a high content of the glass fabric). By so doing, electric conduction between the wiring layers through the inner-via-hole connectors 209 is provided (FIG. 2).

Figure 3C:
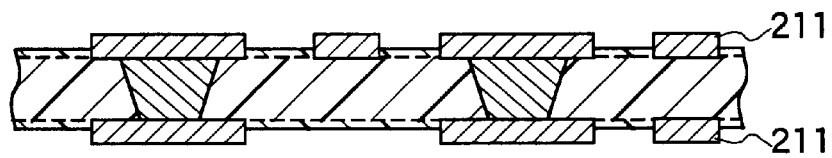

Subsequently, as shown in FIG. 3C, wiring patterns are formed on external surfaces of the copper foils 210, so that lands 211 are formed. Thus, a double-sided circuit board 212 is completed (FIG. 3D).

A multi-layer circuit board is fabricated through a process described below.

Figure 3D:
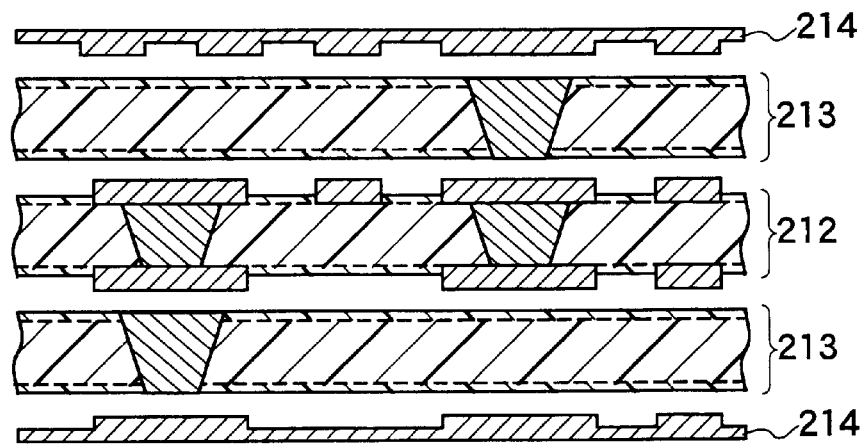
Figure 3E:
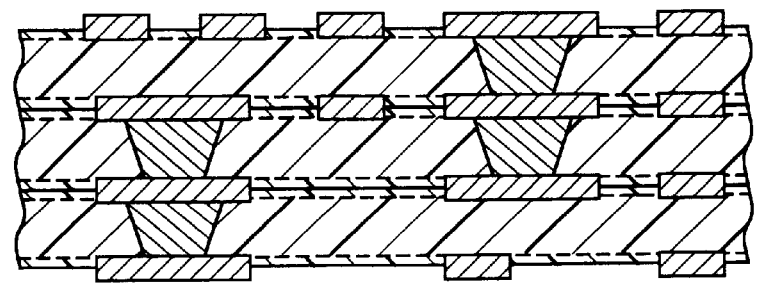

As shown in FIGS. 3D to 3E, glass epoxy prepregs 213 filled with the paste-like copper-epoxy resin composition are laminated on both sides of the aforementioned double-sided circuit board 212, and further on the external surfaces of the same, copper foils 214 on which wiring patterns are formed by partial etching are laminated. After heat and pressure is applied by hot pressing or the like, the copper foils 214 on the external surfaces are patterned, whereby the multi-layer circuit board is completed.

It should be noted that the insulator layer of the present embodiment is not limited to that made of a glass epoxy base material, but may be made of any composite material composed of an organic resin and an inorganic fiber fabric. The composite material is configured in a lamination of the surface parts containing the organic resin as the main component and the core part having the fabric as the main component, in which the surface part, the core part, and the surface part are laminated in the stated order.

A fabric made of an inorganic fiber such as glass fiber may be used as the foregoing fabric.

In the case where a thermoplastic resin is used as the organic resin, the thermoplastic resin is softened by hot pressing and is molded into a desired shape and state having inner-via-hole connectors, insulator layer, and a wiring pattern, whereby a circuit board of the present embodiment can be obtained.

Second Embodiment

Figure 4:
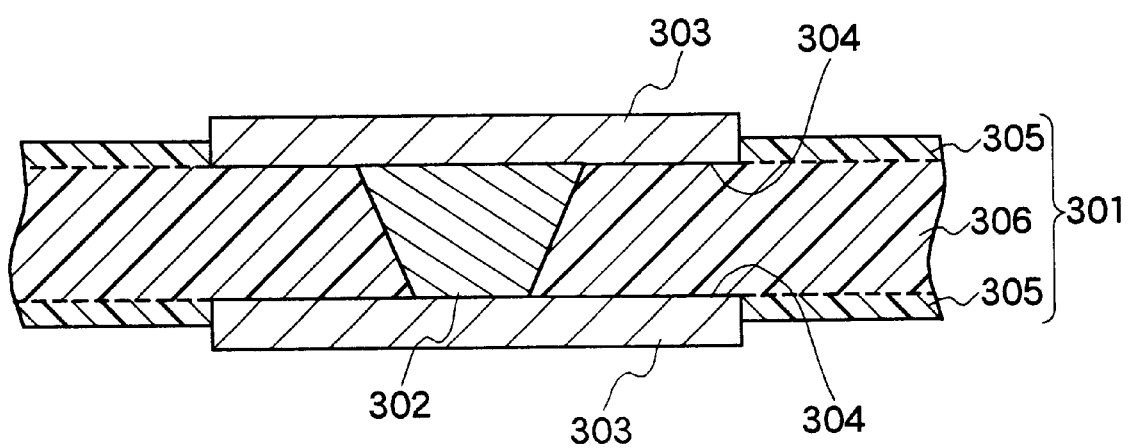
FIG. 4 is a cross-sectional view schematically illustrating a circuit board according to a second embodiment of the present invention.

FIG. 4 is a cross-sectional view of a circuit board (double-sided circuit board) according to a second embodiment of the present invention. As shown in FIG. 4, a circuit board of the present embodiment is composed of an insulator layer 301 made of an organic resin and a nonwoven fabric of an inorganic fiber (a material with a smaller thermal expansion coefficient than that of the organic resin), inner-via-hole connectors 302 formed in the insulator layer 301, and lands 303 embedded in the insulator layer 301. Here, the insulator layer 301 includes surface parts 305 in which the organic resin is a main component (the percentage of the organic resin is high) and a core part 306 in which the inorganic fiber fabric is a main component (the percentage of the organic resin is low), and surfaces 304 of the lands 303 in contact with the inner-via-hole connector 302 substantially are in the planes that include the interfaces between the surface parts 305 and the core part 306. The thickness of the inner-via-hole connector 302 is substantially equal to that of the core part 306.

The circuit board of the present embodiment is configured in the same manner as that of the first embodiment, except that the insulator layer is made of a composite material composed of an organic resin and an inorganic fiber non-woven fabric, and that the composite material is configured in a lamination of the surface parts containing the organic resin as the main component and the core part having the nonwoven fabric as the main component, in which the surface part, the core part, and the surface part are laminated in the stated order.

A nonwoven fabric made of an inorganic fiber such as glass fiber may be adapted as the foregoing nonwoven fabric.

Third Embodiment

Figure 5:
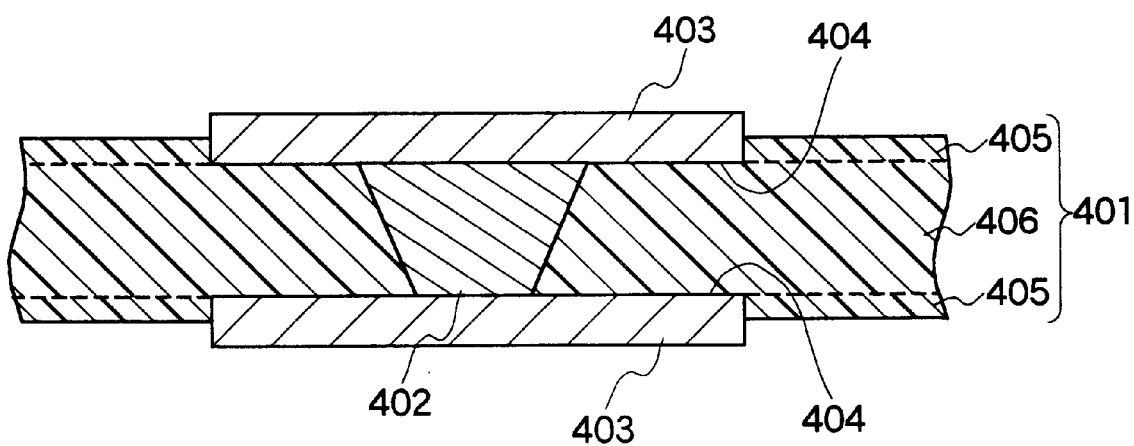
FIG. 5 is a cross-sectional view schematically illustrating a circuit board according to a third embodiment of the present invention.

FIG. 5 is a cross-sectional view of a circuit board (double-sided circuit board) according to a third embodiment of the present invention. As shown in FIG. 5, a circuit board of the present embodiment is composed of an insulator layer 401 made of an organic resin and an organic film (a material with a smaller thermal expansion coefficient than that of the organic resin), inner-via-hole connectors 402 formed in the insulator layer 401, and lands 403 embedded in the insulator layer 401. Here, the insulator layer 401 includes surface parts 405 in which the organic resin is a main component (the percentage of the organic resin is high) and a core part 406 in which the organic film is a main component (the percentage of the organic resin is low), and surfaces 404 of the lands 403 in contact with the inner-via-hole connector 402 substantially are in the planes that include the interfaces between the surface parts 405 and the core part 406. The thickness of the inner-via-hole connector 402 is substantially equal to that of the core part 406.

The circuit board of the present embodiment is configured in the same manner as that of the first embodiment, except that the insulator layer is made of a composite material composed of an organic resin and an organic film, and that the composite material is configured in a lamination of the surface parts containing the organic resin as the main component and the core part having the organic film as the main component, in which the surface part, the core part, and the surface part are laminated in the stated order.

To form an organic film used as a core layer thereof, an organic sheet or film made of synthetic resins such as polyimide, benzocyclobutene (BCB), polytetrafluoroethylene (PTFE), aramid, polyparaphenylene benzobisoxazole (PBO), all aromatic polyesters, or the like, or a film or sheet made of an inorganic insulating material such as ceramic may be used. To form resin layers provided on both the sides, an epoxy resin or a polyimide resin may be used.

Fourth Embodiment

Figure 6:
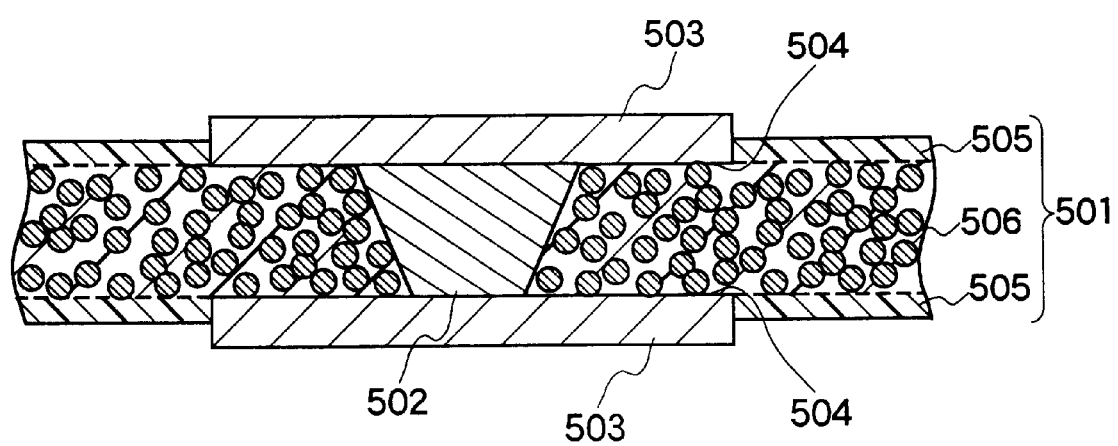
FIG. 6 is a cross-sectional view schematically illustrating a circuit board according to a fourth embodiment of the present invention.

FIG. 6 is a cross-sectional view of a circuit board (double-sided circuit board) according to a fourth embodiment of the present invention. As shown in FIG. 6, a circuit board of the present embodiment is composed of an insulator layer 501 made of an organic resin and an inorganic filler (a material with a smaller thermal expansion coefficient than that of the organic resin), inner-via-hole connectors 502 formed in the insulator layer 501, and lands 503 embedded in the insulator layer 501. Here, the insulator layer 501 includes surface parts 505 in which the organic resin is a main component (the percentage of the organic resin is high) and a core part 506 in which the inorganic filler is a main component (the percentage of the organic resin is low), and surfaces 504 of the lands 503 in contact with the inner-via-hole connector 502 substantially are in the planes that include the interfaces between the surface parts 505 and the core part 506. The thickness of the inner-via-hole connector 502 is substantially equal to that of the core part 506.

The circuit board of the present embodiment is configured in the same manner as that of the first embodiment, except that the insulator layer is made of a composite material composed of an organic resin and an inorganic filler.

Useful as the inorganic filler are aluminum hydroxide, aluminum oxide (alumina), silicon dioxide (silica), silicon nitride, and the like.

Fifth Embodiment

Figure 7:
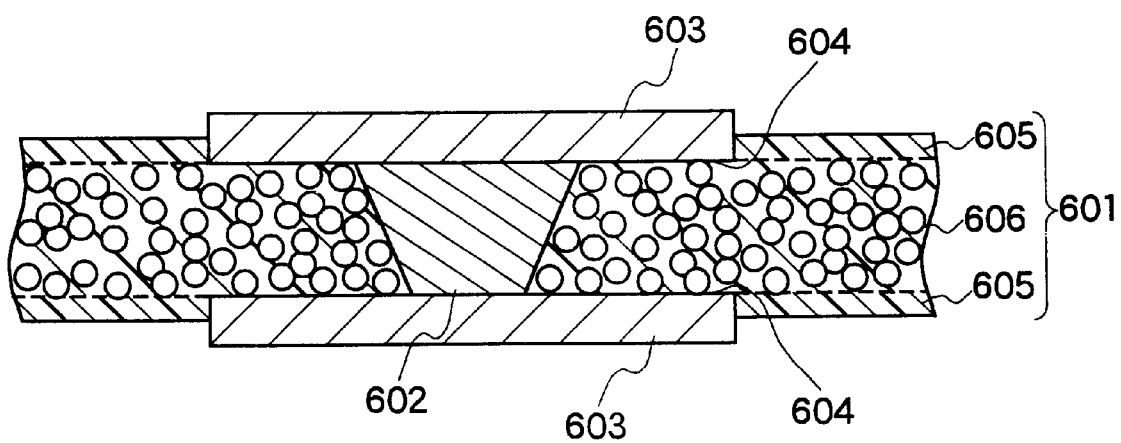
FIG. 7 is a cross-sectional view schematically illustrating a circuit board according to a fifth embodiment of the present invention.

FIG. 7 is a cross-sectional view of a circuit board (double-sided circuit board) according to a fifth embodiment of the present invention. As shown in FIG. 7, a circuit board of the present embodiment is composed of an insulator layer 601 made of an organic resin and a porous material (a material with a smaller thermal expansion coefficient than that of the organic resin), inner-via-hole connectors 602 formed in the insulator layer 601, and lands 603 embedded in the insulator layer 601. Here, the insulator layer 601 includes surface parts 605 in which the organic resin is a main component (the percentage of the organic resin is high) and a core part 606 in which the inorganic filler is a main component (the percentage of the organic resin is low), and surfaces 604 of the lands 603 in contact with the inner-via-hole connector 602 substantially are in the planes that include the interfaces between the surface parts 605 and the core part 606. The thickness of the inner-via-hole connector 602 is substantially equal to that of the core part 606.

The circuit board of the present embodiment is configured in the same manner as that of the first embodiment, except that the insulator layer is made of a composite material composed of an organic resin and a porous material, and that the composite material is configured in a lamination of the surface parts containing the organic resin as the main component and the core part having the porous material as the main component, in which the surface part, the core part, and the surface part are laminated in the stated order.

Useful as the core part containing a porous material as the main component is, for instance, a sheet obtained by impregnating a porous material such as a fluororesin with an organic resin, to which in some cases an inorganic filler is added.

Evaluation Tests

Connection reliability and bond strength of the wiring patterns of the circuit substrates according to the first through fifth embodiments were evaluated. The evaluation of the connection reliability was carried out by an accelerated test and a pressure cooker test in which the samples were left in a saturated aqueous vapor at 121° C. and 0.2 MPa. The evaluation of the adhesive strength was carried out by a 90-degree peeling test to a 1 cm wiring pattern. As a material for forming the inner-via-hole connectors, a composition of a copper powder and an epoxy resin was used. The copper powder was composed of copper particles with a mean particle diameter of 5 μm (85 percent by mass (mass %)), and the epoxy resin composition (15 mass %) was a mixture of dimer acid diglycidyl ether epoxy resin and bisphenol F epoxy resin to which 15 parts of amine adduct powder hardener (AMICURE MY-24 produced by Ajinomoto Co., Inc.) was added. The foregoing composition had a thermal expansion coefficient of 20 μppm.

In the first embodiment, a glass epoxy base material that was formed by impregnating a glass fabric (thickness: 90 μm, thermal expansion coefficient: 5 μppm) with an epoxy resin (thermal expansion coefficient: 60 ppm) so that epoxy resin layers of the surface parts 205 had a thickness of 10 μm each was used as the insulator layer 201. An electrolytic copper foil with a thickness of 18 μm was used as the wiring layer. Each inner-via-hole connector 202 had an upper diameter of 200 μm and a lower diameter of 180 μm (Example 1).

Examples 2 to 4 were identical to Example 1 except that the glass fabrics had thicknesses of 50 μm (Example 2), 15 μm (Example 3), and 200 μm (Example 4), respectively.

In the third embodiment, as to the insulator layer 401, a polyimide film (thickness: 12.5 μm, thermal expansion coefficient: 80 ppm) was used as the core part 406, and a polyimide-based adhesive (thickness: 5 μm, thermal expansion coefficient: 190 ppm) was used as the surface part 405. An electrolytic copper foil with a thickness of 9 μm was used as the wiring layer. Each inner-via-hole connector 402 had an upper diameter of 50 μm and a lower diameter of 45 μm (Example 5).

Examples 6 to 8 were identical to Example 5 except that the polyimide films had thicknesses of 3 μm (Example 6), 9 μm (Example 7), and 25 μm (Example 8), respectively.

In the fourth embodiment, an alumina epoxy composite material (thickness: 50 μm, thermal expansion coefficient: 18 ppm) obtained by dispersing an alumina filler (70 mass %) with a particle diameter of 10 μm in an epoxy resin was used as the core part 506, and an epoxy resin (thickness: 5 μm, thermal expansion coefficient: 60 ppm) was used as the surface part 505. An electrolytic copper foil with a thickness of 9 μm was used as the wiring layer. Each inner-via-hole connector 502 had an upper diameter of 150 μm and a lower diameter of 140 μm (Example 9).

Examples 10 to 12 were identical to Example 9 except that the alumina epoxy composite material had thicknesses of 20 μm (Example 10), 70 μm (Example 11), and 100 μm (Example 12), respectively.

In the fifth embodiment, as to the insulator layer 601, a composite material (thickness: 35 μm, thermal expansion coefficient: 26 ppm) obtained by impregnating a porous sheet made of a fluororesin (polytetrafluoroethylene) with a silica-dispersed epoxy resin was used as the core part 606, and an epoxy resin (thickness: 5 μm, thermal expansion coefficient: 60 ppm) was used as the surface part 605. An electrolytic copper foil with a thickness of 9 μm was used as the wiring layer. Each inner-via-hole connector 602 had an upper diameter of 50 μm and a lower diameter of 45 μm (Example 13).

Examples 14 to 16 were identical to Example 13 except that the composite materials made of the porous sheet impregnated with a silica-dispersed epoxy resin had thicknesses of 10 μm (Example 14), 20 μm (Example 16), and 50 μm (Example 16), respectively.

In the first embodiment, a filler-containing glass epoxy substrate that was formed by impregnating a glass fabric (thickness: 90 μm, thermal expansion coefficient: 5 ppm) with a silica-filler (particle diameter: 3 μm)-dispersed epoxy resin so that epoxy resin layers of the surface parts 205 had a thickness of 5 μm each was used as the insulator layer 201. The content of the silica filler in the surface parts 205 was set to 5 percent by volume (vol %) (Example 17), 20 vol % (Example 18), 50 vol % (Example 19), and 70 vol % (Example 20).

Figure 8:
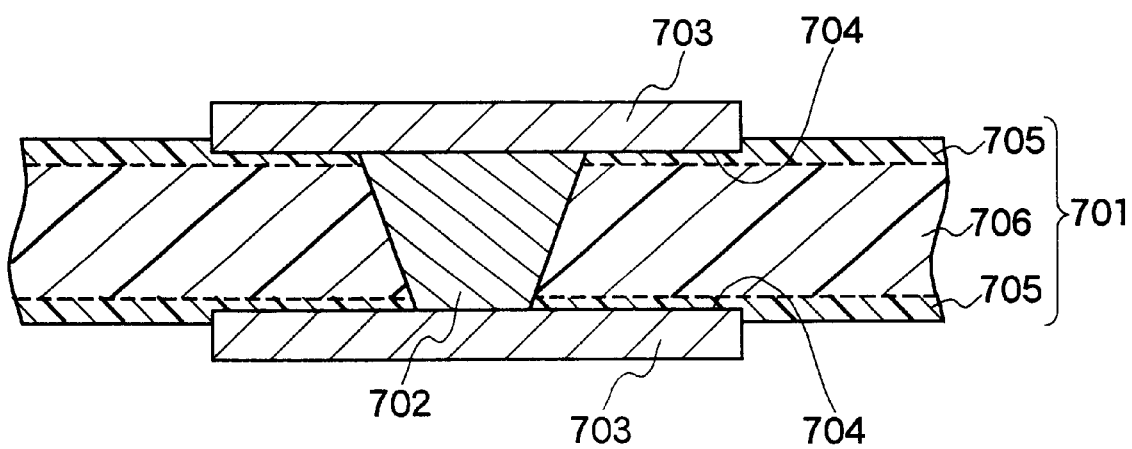
FIG. 8 is a cross-sectional view schematically illustrating a circuit board of a comparative example.

For comparison with Examples 1 to 20, circuit boards configured as shown in FIG. 8 were produced using the same materials as those of the circuit boards in the foregoing embodiments and were subjected to the tests (Comparative Examples 1 to 20).

In the circuit substrate shown in FIG. 8, a land 703 embedded in an insulator layer 701 had a surface in contact with an inner-via-hole connector 702 inside a surface layer 705, and the inner-via-hole connector 702 had a thickness greater than that of a core part 706.

Furthermore, a circuit board that was identical to Examples 17 to 20 except that the content of the silica filler was 85 vol % was prepared as a comparative example to Examples 17 to 20 (Comparative Example 21).

Table 1 below shows the outcomes of the evaluation test.

TABLE 1

| NO. | BOND STRENGTH | CONNECTION RELIABILITY |
| --- | --- | --- |
| EX. 1 | ○ | ○ |
| EX. 2 | ○ | ○ |
| EX. 3 | ○ | ○ |
| EX. 4 | ○ | ○ |
| EX. 5 | ○ | ○ |
| EX. 6 | ○ | ○ |
| EX. 7 | ○ | ○ |
| EX. 8 | ○ | ○ |
| EX. 9 | ○ | ○ |
| EX. 10 | ○ | ○ |
| EX. 11 | ○ | ○ |
| EX. 12 | ○ | ○ |
| EX. 13 | ○ | ○ |
| EX. 14 | ○ | ○ |
| EX. 15 | ○ | ○ |
| EX. 16 | ○ | ○ |
| EX. 17 | ○ | ○ |
| EX. 18 | ○ | ○ |
| EX. 19 | ○ | ○ |
| EX. 20 | ○ | ○ |
| COM. EX. 1 | X | ○ |
| COM. EX. 2 | X | ○ |
| COM. EX. 3 | X | ○ |
| COM. EX. 4 | X | ○ |
| COM. EX. 5 | X | ○ |
| COM. EX. 6 | X | ○ |
| COM. EX. 7 | X | ○ |
| COM. EX. 8 | X | ○ |
| COM. EX. 9 | X | ○ |
| COM. EX. 10 | X | ○ |
| COM. EX. 11 | X | ○ |
| COM. EX. 12 | X | ○ |
| COM. EX. 13 | X | ○ |
| COM. EX. 14 | X | ○ |
| COM. EX. 15 | X | ○ |
| COM. EX. 16 | X | ○ |
| COM. EX. 17 | X | ○ |
| COM. EX. 18 | X | ○ |
| COM. EX. 19 | X | ○ |
| COM. EX. 20 | X | ○ |
| COM. EX. 21 | ○ | X |

As to evaluation criteria, the connection reliability was evaluated as × in the case where a wiring circuit including an inner-via-hole connector was broken within 168 hours, and it was evaluated as ○ in the case where a resistance did not vary more than 10%. The bond strength was evaluated as ○ in the case of not less than 15 N, and it was evaluated as × in the case of less than 15 N.

As seen in the above Table 1, according to the first through fifth embodiments of the present invention, it is possible to obtain a circuit board that excels in connection reliability and wiring pattern bond strength.

It should be noted that in the case where another insulator layer material in the foregoing embodiments is used, it is also possible to obtain a circuit board that excels in connection reliability and wiring pattern adhesive strength, as in the cases of Examples 1 to 20.

Sixth Embodiment

FIGS. 9A to 9E are cross-sectional views illustrating steps of a circuit board producing process according to the present embodiment, respectively, which are shown in an order in which the steps are carried out.

Figure 9A:
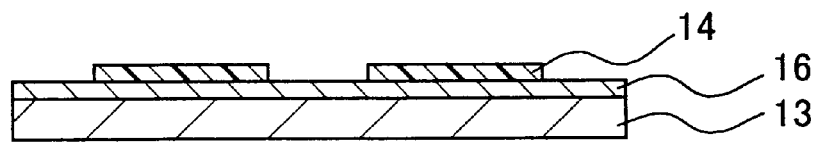
FIGS. 9A to 9E are cross-sectional views schematically illustrating a process of producing a circuit board according to a sixth embodiment of the present invention.
Figure 9B:
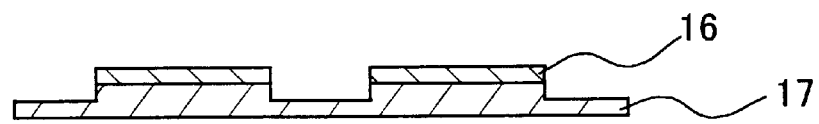

First of all, as shown in FIG. 9A, a metal film 16 (Ni) is formed on a thick copper foil 13 (35 μm) by plating, vapor deposition, sputtering, or another technique, with a resist 14 formed thereon. Subsequently, the metal film and the thick copper foil were etched to a predetermined thickness, and the resist 14 was removed, so that a metal-film-laminated thick copper foil 17 was obtained as shown in FIG. 9B. A material made of one selected from Au, Ag, Cr, Pb, Zn, Ni, and Sn may be used for forming the metal film.

Figure 9C:
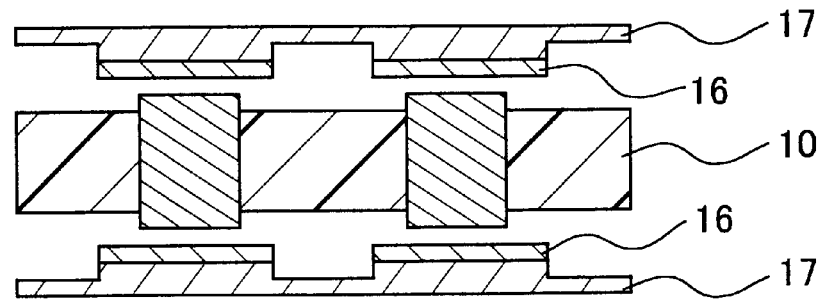
Figure 9D:
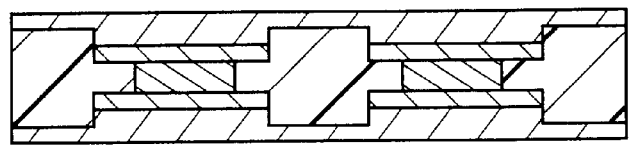
Figure 9E:
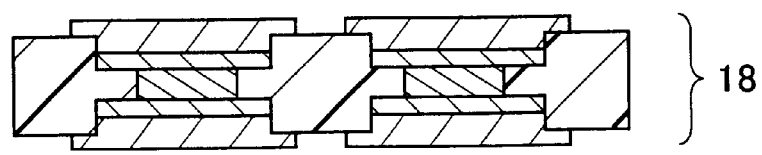

Next, as shown in FIG. 9C, the metal-film-laminated thick copper foils 17 were provided on both sides of a filled prepare base material 10. Then, as shown in FIG. 9D, a predetermined pressure was applied thereto at a predetermined curing temperature of the prepare base material by a press machine, for complete adhesion, and the copper foil was then patterned. Consequently, a double-sided board 18 shown in FIG. 9E was obtained.

As in the third embodiment, it is possible to produce a multi-layer board through a subsequent process, which however is omitted herein.

Furthermore, it is effective to use a thick copper foil whose recessed portions formed by etching as shown in FIG. 9B have been subjected to a blackening treatment, a chromate treatment, or a roughening treatment.

As described above, according to the present embodiment, a circuit board in which a conductive paste provides electric connection between layers is obtained by perforating a prepare base material, filling a conductive paste, providing copper foils on both sides, and carrying out hot pressing thereon, so that the copper foils provided on both surfaces of the prepare base material are electrically connected. In the case where a glass epoxy base material is used, there has been a drawback in that stable connection between layers with a minimum of compressibility cannot be secured. In the foregoing circuit board, however, more stable connection between layers can be achieved by providing protrusions on a thick copper foil by partial etching, and compressing the conductive paste portions with the protrusions.

In the sequential technique in which multiple layers are sequentially provided on the innermost core layer, protrusions are provided on both sides of the innermost core layer so that in the adjacent layer a conductive paste can be compressed at the protrusions, and this allows ordinary electrolytic copper foils (for instance, GT-GLD 18 μm produced by Furukawa Circuit Wheel) to be adapted as the layers subsequently provided.

Therefore, a base material with low all-layer compressibility (for instance, glass epoxy base material FR-4 available from Hitachi Chemical Co., Ltd.) may be used. In other words, it is possible to render a base material configuration suitable for required performance, for instance, high bandwidth, or high reliability.

Besides, upon partial etching, by applying a blackening treatment, a chromate treatment, or the like to portions other than the protruded portions, the metal filler contained in the conductive paste and the copper foil are made to adhere to each other readily. Thus, the adhesive strength of the copper foil is increased at the portions processed by the foregoing treatment.

Furthermore, upon partial etching, in the case where the roughness of the surfaces of the copper foil except the protruded portions is increased, the adhesive strength is increased as in the foregoing case. On the other hand, in the case where the roughness is decreased, this is advantageous for finer patterning. This allows product planning to match customers demands freely.

A circuit board in which lands are produced by partial etching of a metal foil is shown as the present embodiment. A patterned wiring that will constitute lands, however, may be formed by full etching on a sacrificial board, and may be used for forming a circuit board of the present invention.

Seventh Embodiment

FIGS. 10A to 10E are cross-sectional views schematically illustrating a circuit board (double-sided circuit board) according to a seventh embodiment of the present invention. The circuit board of the present embodiment is composed of an insulator layer 201 made of an organic resin and a fabric of an inorganic fiber (a material with a smaller thermal expansion coefficient than that of the organic resin), inner-via-hole connectors 202 formed in the insulator layer 201, and lands 203 embedded in the insulator layer 201. Here, the insulator layer 201 includes surface parts 205 in which the organic resin is a main component (the percentage of the organic resin is high) and a core part 206 in which the inorganic fiber fabric is a main component (the percentage of the organic resin is low), and surfaces 204 of the lands 203 in contact with the inner-via-hole connector 202 substantially are in the planes that include the interfaces between the surface parts 205 and the core part 206. The thickness of the inner-via-hole connector 202 is substantially equal to that of the core part 206.

The following description will depict the circuit substrate according to the present embodiment in more detail, by taking as an example a case where the insulator layer 201 is made of a glass epoxy base material, the inner-via-hole connector 202 is made of a composition of copper and an epoxy resin, and the wiring layer is made of a copper foil.

Figure 10A:
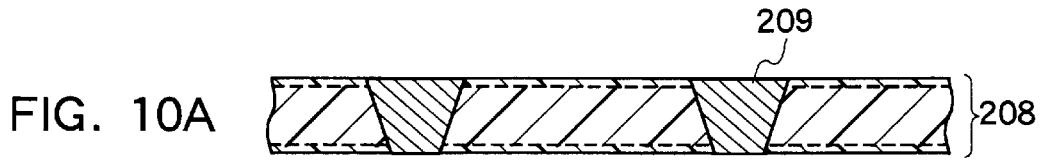
FIGS. 10A to 10E are cross-sectional views schematically illustrating a process of producing a double-sided circuit board according to a seventh embodiment of the present invention.

First of all, as shown in FIG. 10A, a glass epoxy prepare 208 in a prepare state (semi-hardened state) (the thickness of a core layer: 100 $\mu$m, each thickness of resin layers on the surfaces: 10 $\mu$m) is perforated so that through holes are provided at desired positions, by applying, from above, one to three shots of a carbon dioxide gas laser having a wavelength of 9.4 $\mu$m or 10.6 $\mu$m. The through holes are filled with a paste-like resin composition 209, from a side of the wider openings of the through holes, by printing or another technique.

Figure 10B:
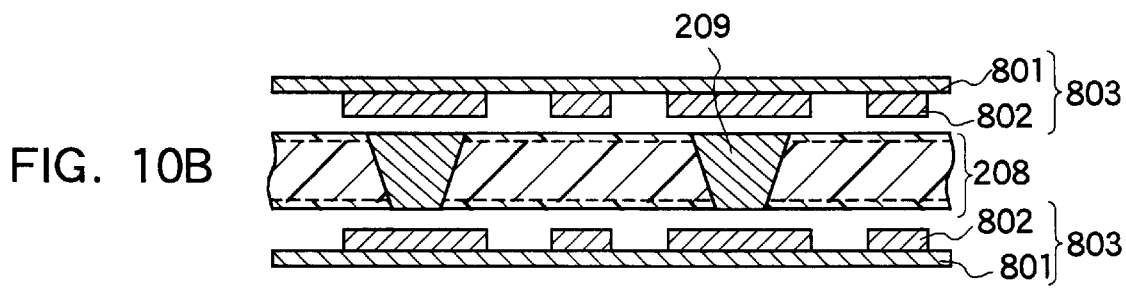

Next, a 50 $\mu$m-thick aluminum plate as a carrier 801 on whose surface an 18 $\mu$m-thick copper foil 802 is laminated is used as a transfer formative base 803. This allows lands to be protruded from the glass epoxy prepare base material 208, thereby allowing the protruded portions to be laminated subsequently so as to be embedded in the insulator layer. These transfer formative bases 803 are provided on both sides of the glass epoxy prepare base material 208, as shown in FIG. 10B.

Next, hot pressing is applied for heating and pressurization. As to the conditions for the same, the heating temperature, the pressure, and the heating time are 180° C. to 250° C., 30 kgf/cm$^2$ to 200 kgf/cm$^2$, and 0.5 hour to 2 hours, respectively.

Figure 10C:
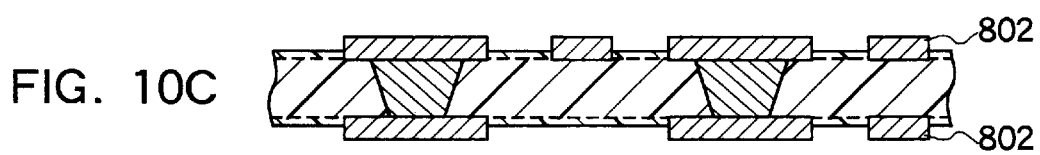

This process allows the epoxy resin as the thermosetting resin to be hardened, and the glass epoxy prepare 208 and the wiring pattern 802 to adhere to each other. The glass epoxy base material, which is the glass epoxy prepare 208 in which the epoxy resin has been hardened, constitutes the insulator layer. This process also allows the copper foil 802 to be embedded in the insulator layer so that a surface of the copper foil 802 on which the wiring pattern is provided substantially is in the plane that includes the interface between the surface part of the insulator layer in which the percentage of the epoxy resin is high and the core part of the insulator layer in which the percentage of the glass fabric is high (the percentage of the epoxy resin is high). Thus, electric conduction between the wiring layers is provided by the inner-via-hole connectors 209 (FIG. 10C). Subsequently, the entirety of the aluminum carrier 801 is removed by etching with hydrochloric acid. Through the process described so far, a double-sided circuit board 212 (FIG. 10D) is completed.

A multi-layer circuit board is produced as described below.

Figure 10D:
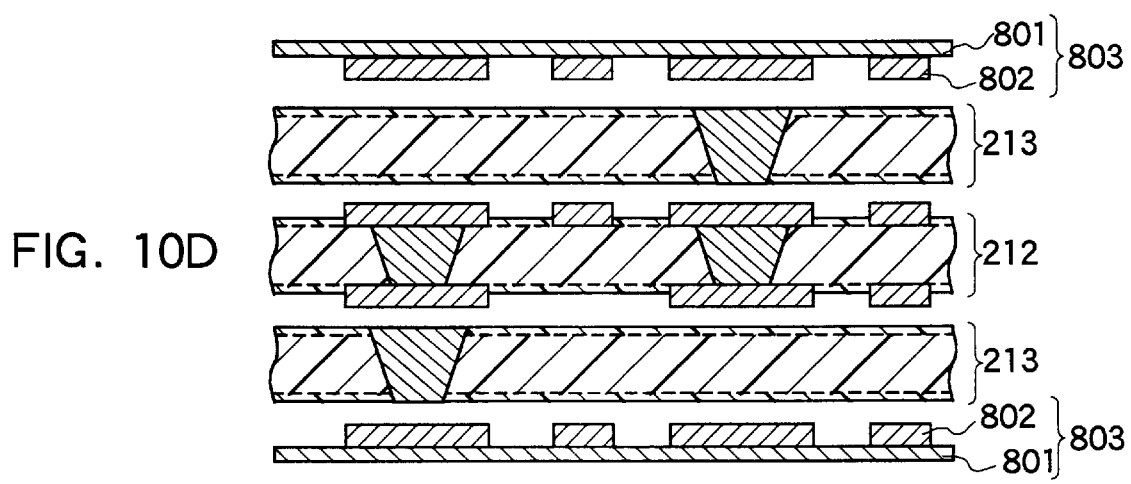
Figure 10E:
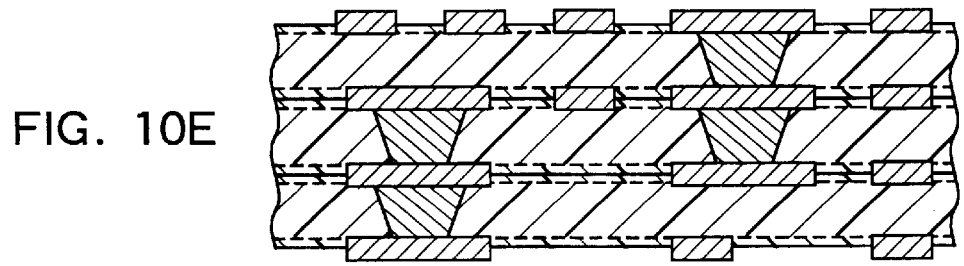

As shown in FIGS. 10D to 10E, the glass epoxy prepregs 213 filled with a paste-like copper-epoxy resin composition are placed on both sides of the above-described double-sided circuit board 212, and then, the transfer materials 803 are placed on external sides of the same as described above. After heat and pressure is applied by hot pressing or the like, the aluminum carrier 801 is removed. The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A circuit board, comprising:
   not less than two wiring layers;
   an insulator layer for electric insulation between the wiring layers; and
   an inner-via-hole conductive member provided in the insulator layer in a thickness direction of the insulator layer for electric connection between the wiring layers, wherein:
   the insulator layer is made of a composite material containing an organic resin and a material having a smaller thermal expansion coefficient than that of the organic resin, and includes a surface part, a core part, and a surface part laminated in the stated order, each surface part having a higher content of the organic resin than the core part;
   the wiring layers have land portions on both sides of the insulator layer that are connected with the inner-via-hole conductive member and are embedded so as to be substantially in contact with both sides of the core part; and
   the inner-via-hole conductive member has a thickness substantially equal to a thickness of the core part.

2. The circuit board according to claim 1, wherein the land portion is embedded to a depth in a range of 2 $\mu$m to 50 $\mu$m.

3. The circuit board according to claim 1, wherein the land portion protrudes from the surface part.

4. The circuit board according to claim 3, wherein a height of protrusion of the land portion is in a range of 2 $\mu$m to 50 $\mu$m.

5. The circuit board according to claim 1, wherein the core part includes at least one selected from a fabric of an inorganic fiber, a nonwoven fabric of an inorganic fiber, and a synthetic resin film.

6. The circuit board according to claim 5, wherein the core part includes the inorganic fiber, and the inorganic fiber is glass.

7. The circuit board according to claim 5, wherein the synthetic resin film is a film made of at least one selected from the group consisting of polyimide, benzocyclobutene (BCB), polytetrafluoroethylene (PTFE), aramid, polyparaphenylene benzobisoxazole (PBO), and all aromatic polyesters.

8. The circuit board according to claim 5, wherein the core part further contains an inorganic filler.

9. The circuit board according to claim 8, wherein the inorganic filler is at least one filler selected from the group consisting of aluminum hydroxide, aluminum oxide (alumina), silicon dioxide (silica), and silicon nitride.

10. The circuit board according to claim 5, wherein the core part includes the synthetic resin fiber, and the synthetic resin film is made of a porous material.

11. The circuit board according to claim 10, wherein the porous material is impregnated with a composition of an inorganic filler and an organic resin.

12. The circuit board according to claim 11, wherein the porous material is made of a fluororesin, and the inorganic filler is at least one filler selected from the group consisting of aluminum hydroxide, aluminum oxide (alumina), silicon dioxide (silica), and silicon nitride.

13. The circuit board according to claim 1, wherein the organic resin is at least one resin selected from the group consisting of epoxy resins, polyimide resins, cyanate ester resins, phenol resol resins, all aromatic polyester resins, polyphenylene ether (PPE) resins, bismaleimide triazine resins, and fluororesins.

14. The circuit board according to claim 13, wherein the organic resin further is impregnated with at least one filler selected from the group consisting of aluminum hydroxide, aluminum oxide (alumina), silicon dioxide (silica), and silicon nitride.

15. The circuit board according to claim 1, wherein the inner-via-hole conductive member is made of a composition of a conductive filler and an organic resin.

16. The circuit board according to claim 15, wherein the conductive filler is made of at least one selected from the group consisting of gold, silver, copper, nickel, palladium, lead, tin, indium, and bismuth, alloys of these, and mixtures of these.

17. The circuit board according to claim 15, wherein a through hole filled with the inner-via-hole conductive member has a cross section in a tapered shape, and the inner-via-hole conductive member is put into the through hole from a wider opening of the through hole.

* * * * *